(12) United States Patent
Ookuma et al.

(10) Patent No.: US 6,414,395 B1
(45) Date of Patent: Jul. 2, 2002

(54) SEMICONDUCTOR DEVICE CAPABLE OF PREVENTING DISCONNECTION IN A THROUGH HOLE

(75) Inventors: Yuuko Ookuma; Kimio Hagi, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/398,475

(22) Filed: Sep. 17, 1999

(30) Foreign Application Priority Data

May 24, 1999 (JP) .............................. 11-142899

(51) Int. Cl.[7] .......................... H01L 23/48; H01L 23/52
(52) U.S. Cl. ...................... 257/773; 257/751; 257/774
(58) Field of Search ................. 257/751, 753, 257/758, 773, 774; 438/618, 629, 637, 639

(56) References Cited

U.S. PATENT DOCUMENTS 3,972,750 A * 8/1976 Gutierrez et al. ............. 257/10
5,498,889 A * 3/1996 Hayden ....................... 257/301
5,804,847 A * 9/1998 Robinson .................... 257/257
5,990,555 A * 11/1999 Ohori et al. ................ 257/750

FOREIGN PATENT DOCUMENTS

JP 6-13381 * 1/1994

* cited by examiner

Primary Examiner—Steven Loke
Assistant Examiner—Hung Kim Vu
(74) Attorney, Agent, or Firm—McDermott, Will & Emery

(57) ABSTRACT

A through hole passes through an interlayer isolation film and an antireflection film, to partially expose a surface of a first wiring layer. A clearance filling member fills up a clearance under an inner edge of the antireflection film. A barrier metal film continuously covers the exposed surface of the first wiring layer, an inner wall surface of the through hole and a surface of the interlayer isolation film. Passing through the through hole, a second wiring layer is connected with the first wiring layer through the barrier metal film. Thus provided is a method of fabricating a semiconductor device improved to be capable of avoiding disconnection of a wire in a through hole.

5 Claims, 7 Drawing Sheets

SEMICONDUCTOR DEVICE CAPABLE OF PREVENTING DISCONNECTION IN A THROUGH HOLE

BACKGROUND OF THE INVENTION

1. Field of the Invention

The present invention generally relates to a semiconductor device, and more specifically, it relates to a semiconductor device improved to be capable of preventing disconnection in a through hole. The present invention also relates to a method of fabricating such a semiconductor device. The present invention further relates to an apparatus for fabricating such a semiconductor device.

2. Description of the Prior Art

FIG. 14 is a sectional view showing a part of a conventional integrated circuit provided with wires.

Referring to FIG. 14, a lower aluminum wire 2 is formed on an interlayer isolation film 20 provided on a semiconductor substrate 22. Another interlayer isolation film 3 is formed on the interlayer isolation film 20, to cover the aluminum wire 2. A through hole 21 for partially exposing a surface of the aluminum wire 2 is formed in the interlayer isolation film 3. An upper aluminum wire 1, connected with the lower aluminum wire 2 through the through hole 21, is provided on the interlayer isolation film 3. In other words, the lower aluminum wire 2 is connected with the upper aluminum wire 1 through the through hole 21. In the portion of the through hole 21, the upper aluminum wire 1 is generally formed by a laminate of a barrier metal film and an aluminum wire.

A method of fabricating the conventional integrated circuit connecting the upper and lower wires through the through hole is now described.

Referring to FIG. 15, the lower aluminum wire 2 provided with an antireflection film 5 thereon is formed on the interlayer isolation film 20. The interlayer isolation film 3 is formed on the interlayer isolation film 20, to cover the aluminum wire 2. A resist pattern 4 having an opening 4a in a portion for forming the through hole 21 is formed on the interlayer isolation film 3.

Referring to FIGS. 15 and 16, the interlayer isolation film 3 is etched through the resist pattern 4 serving as a mask, for forming the through hole 21 partially exposing the surface of the aluminum wire 3 in the interlayer isolation film 3. At this time, an inner edge 5a of the antireflection film 5 horizontally extends in the through hole 21.

Referring to FIGS. 17 and 18, the surface of the aluminum wire 2 is etched by sputtering with $Ar^+$, to be cleaned. Thereafter a barrier metal layer 7 is formed to cover an inner wall of the through hole 21.

Referring to FIG. 19, the upper aluminum wire 8 connected with the lower aluminum wire 2 is formed through the through hole 21.

The conventional method of fabricating a semiconductor device provided with multilayer wires, carried out in the aforementioned manner, has the following problem:

Referring to FIG. 19, the inner edge 5a of the antireflection film 5 horizontally extends in the through hole 21, to define a clearance under the inner edge 5a. Thus, the upper aluminum wire 8 cannot fill up the clearance and is hence disadvantageously disconnected.

SUMMARY OF THE INVENTION

The present invention has been proposed in order to solve the aforementioned problem, and an object thereof is to provide a method of fabricating a semiconductor device, which is so improved that an upper wire is not disconnected in a through hole portion.

Another object of the present invention is to provide a semiconductor device obtained by such a fabrication method.

Still another object of the present invention is to provide a fabrication apparatus capable of implementing such a method of fabricating a semiconductor device.

A semiconductor device according to a first aspect of the present invention comprises a semiconductor substrate. A first wiring layer having an antireflection film thereon is provided on the semiconductor substrate. An interlayer isolation film is provided on the semiconductor substrate, to cover the first wiling layer. A through hole partially exposing a surface of the first wiring layer passes through the interlayer isolation film and the antireflection film. An inner edge of the antireflection film horizontally extends in the through hole. The semiconductor device further comprises a clearance filling member filling up a clearance under the inner edge and a barrier metal film continuously covering the exposed surface of the first wiring layer, an inner wall surface of the through hole and a surface of the interlayer isolation film. Passing through the through hole, a second wiring layer is provided on the interlayer isolation film to be connected with the first wiring layer through the barrier metal film.

According to this aspect, the clearance filling member fills up the clearance under the inner edge of the antireflection film, whereby the second wiring layer is embedded in the through hole without disconnection and connected with the first wiring layer.

In a semiconductor device according to a second aspect of the present invention, the clearance filling member is made of a material obtained by etching the inner wall surface of the through hole and the exposed surface of the first wiling layer, including a surface of the semiconductor substrate, by sputtering.

According to this aspect, the clearance filling member is made of the material obtained by etching the surface of the semiconductor substrate by sputtering, whereby the clearance can be readily filled up.

In a semiconductor device according to a third aspect of the present invention, the clearance filling member is formed by bulging the exposed surface of the first wiring layer.

According to this aspect, the clearance filling member, which is formed by bulging the surface of the first wiring layer, can be readily formed.

In a method of fabricating a semiconductor device according to a fourth aspect of the present invention, a first wiring layer provided with an antireflection film thereon is formed on a semiconductor substrate. An interlayer isolation film is formed on the semiconductor substrate, to cover the first wiring layer. A through hole passing through the interlayer isolation film and the antireflection film and partially exposing a surface of the first wiring layer is formed. A clearance under an inner edge of the antireflection film defined in formation of the through hole is filled up with a filler. The exposed surface of the first wiring layer, an inner wall surface of the through hole and a surface of the interlayer isolation film are continuously covered with a barrier metal film. Passing through the through hole, a second wiring layer is formed on the interlayer isolation film to be connected with the first wiring layer through the barrier metal film.

According to this aspect, the clearance under the inner edge of the antireflection film defined in formation of the through hole is filled up with the filler, whereby the second wiling layer can be connected with the first wiring layer without disconnection.

In a method of fabricating a semiconductor device according to a fifth aspect of the present invention, the step of filling up the clearance under the inner edge with the filler includes first and second sputter-etching steps of etching a surface (including a bottom portion and a side wall surface of the through hole) of the semiconductor substrate by sputtering thereby forming a side wall spacer on the inner wall of the through hole and etching the bottom portion of the through hole by sputtering thereby cleaning the surface of the first wiring layer.

According to this aspect, the clearance under the inner edge is filled up by etching the surface of the semiconductor substrate by sputtering thereby forming the side wall spacer on the inner wall of the through hole.

In a method of fabricating a semiconductor device according to a sixth aspect of the present invention, the first sputter-etching step is carried out under a high pressure of 1 to 20 mTorr, and the second sputter-etching step is carried out under a low pressure of 0.1 to 5 mTorr.

According to this aspect, the first sputter-etching step is carried out under the high pressure of 1 to 20 mTorr, whereby the clearance under the inner edge can be efficiently filled up with the filler.

In a method of fabricating a semiconductor device according to a seventh aspect of the present invention, the sputter-etching in the first sputter-etching step is performed obliquely to the semiconductor substrate, and the sputter-etching in the second sputter-etching step is performed perpendicularly to the semiconductor substrate.

According to this aspect, the sputter-etching in the first sputter-etching step is performed obliquely to the semiconductor substrate, whereby the clearance under the inner edge can be excellently filled up with the filler.

In a method of fabricating a semiconductor device according to an eighth aspect of the present invention, the sputter-etching in the first sputter-etching step is performed under a high pressure of 1 to 20 mTorr, and the sputter-etching in the second sputter-etching step is performed under a low pressure of 0.1 to 5 mTorr.

According to this aspect, the sputter-etching in the first sputter-etching step is performed under the high pressure of 1 to 20 mTorr, whereby the clearance under the inner edge can be excellently filled up with the filler.

In a method of fabricating a semiconductor device according to a ninth aspect of the present invention, the step of filling up the clearance under the inner edge with the filler includes a step of bulging the exposed surface of the first wiring layer.

According to this aspect, the exposed surface of the first wiling layer is bulged, whereby the clearance under the inner edge can be efficiently filled up with the filler.

In a method of fabricating a semiconductor device according to a tenth aspect of the present invention, the step of bulging the exposed surface of the first wiring layer includes steps of increasing the temperature of the semiconductor substrate to 250° C. to 500° C. and etching the exposed surface of the first wiring layer by sputtering.

According to this aspect, the clearance under the inner edge can be efficiently filled up with the filler.

An apparatus for fabricating a semiconductor device according to an eleventh aspect of the present invention comprises a support supporting a semiconductor substrate formed with a through hole and a sputter-etching device obliquely etching a surface (including a side wall and a bottom surface of the through hole) of the semiconductor substrate by sputtering.

According to this aspect, the apparatus comprises the sputter etching device obliquely etching the surface of the semiconductor substrate by sputtering, whereby a clearance under an inner edge of an antireflection film can be efficiently filled up with a filler.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

FIGS. 1 to 6 are sectional views showing steps in a method of fabricating a semiconductor device according to a first embodiment of the present invention.

Figure 1:
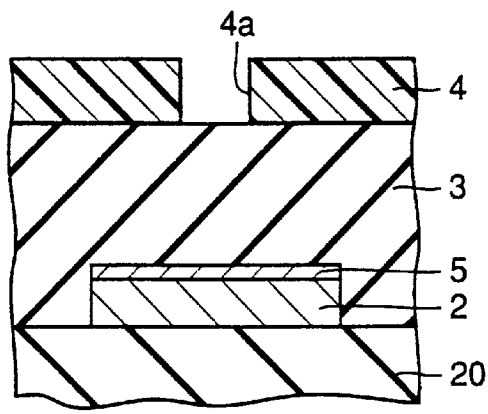
FIGS. 1 to 6 are sectional views successively showing first to sixth steps of a method of fabricating a semiconductor device according to a first embodiment of the present invention.

Referring to FIG. 1, an aluminum wire 2 having an antireflection film 5 thereon is formed on an interlayer isolation film 20 formed on a semiconductor substrate (not shown). Another interlayer isolation film 3 is formed on the interlayer isolation film 20, to cover the aluminum wire 2.

A resist pattern 4 having an opening 4a in a portion for forming a through hole is formed on the interlayer isolation film 3.

Figure 2:
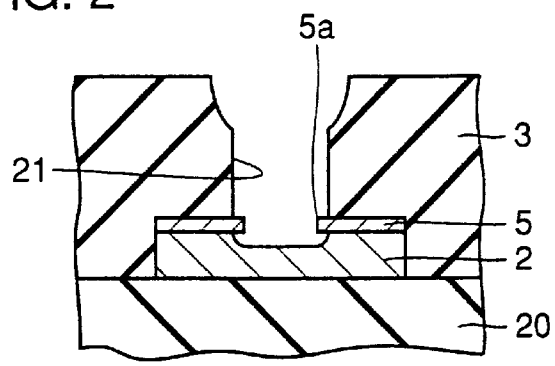

Referring to FIGS. 1 and 2, the interlayer isolation film 3 and the antireflection film 5 are etched through the resist pattern 4 serving as a mask, for exposing a surface of the aluminum wire 2. Thereafter the resist pattern 4 is removed. In this etching, an inner edge 5a of the antireflection film 5 remains to horizontally extend in the through hole 21, as shown in FIG. 2.

Figure 3:
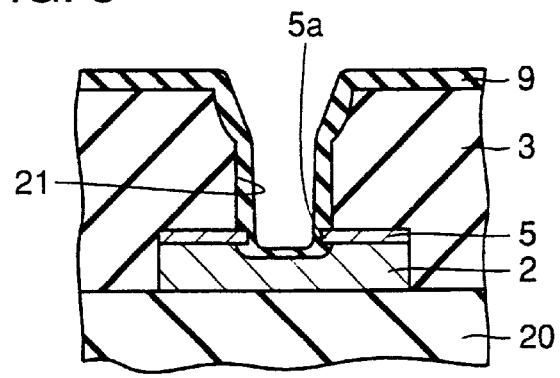

Referring to FIG. 3, a surface of the semiconductor substrate is etched by sputtering under a high pressure of 1 to 20 mTorr, thereby forming a compound film 9 consisting of a compound of aluminum and an oxide on an inner wall of the through hole 21.

Figure 4:
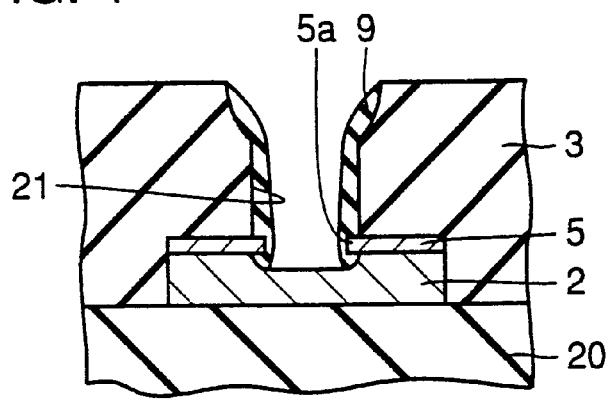

Referring to FIGS. 3 and 4, the surface (including a side wall and a bottom surface of the through hole 21) of the semiconductor substrate is etched by sputtering under a low pressure of 0.1 to 5 mTorr, thereby removing parts of the compound film 9 present on the aluminum wire 2 and the interlayer isolation film 3 in the bottom portion of the through hole 21.

Figure 5:
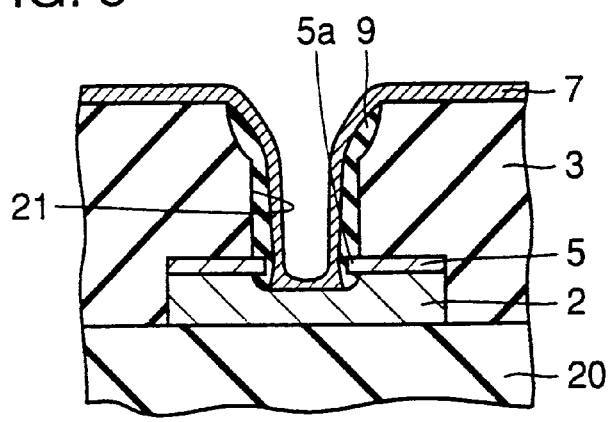

Referring to FIG. 5, a barrier metal layer 7 is formed on the semiconductor substrate, to cover the inner wall and the bottom surface of the through hole 21.

Figure 6:
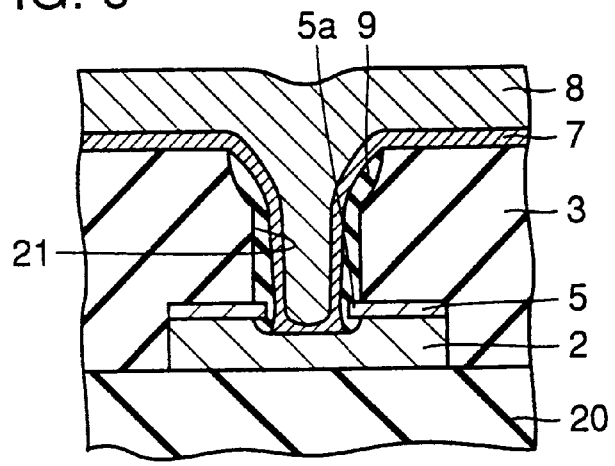

Referring to FIG. 6, an aluminum wire 8 is formed on the semiconductor substrate, to be embedded in the through hole 21.

According to the first embodiment, the sputter-etching before forming the barrier metal layer 7 is performed through two steps, i.e., the high-pressure sputter-etching step and the low-pressure sputter etching-step, thereby forming a side wall spacer 9 consisting of the compound film 9 on the inner wall surface of the through hole 21 and filling up a clearance under the inner edge 5a of the antireflection film 5, whereby the upper aluminum wire 8 can be prevented from disconnection in the through hole 21.

Second Embodiment

In a method of fabricating a semiconductor device according to a second embodiment of the present invention, steps similar to those shown in FIGS. 1 and 2 are first carried out similarly to the first embodiment.

Figure 7:
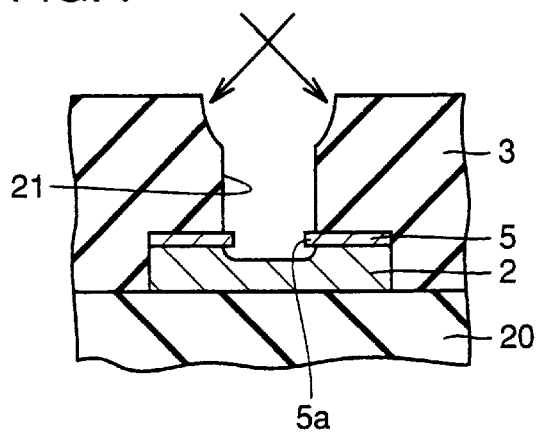
FIGS. 7 and 8 are sectional views showing first and second steps of a principal part of a method of fabricating a semiconductor device according to a second embodiment of the present invention.

Referring to FIG. 7, sputter-etching is performed obliquely to a surface of a semiconductor substrate (wafer) under a high pressure of 1 to 20 mTorr. This sputter-etching is performed with a sputter-etching device including a support supporting the semiconductor substrate formed with a through hole 21 and a sputter-etching member obliquely sputter-etching the surface of the semiconductor substrate.

Figure 8:
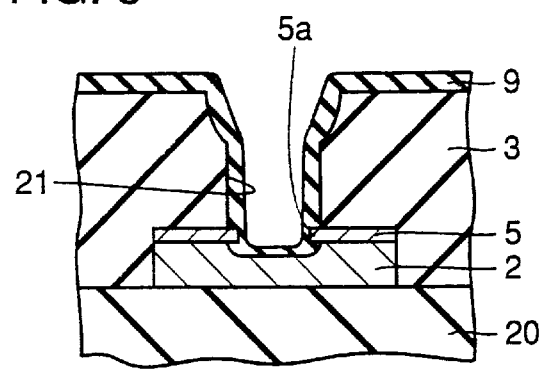

Through this sputter-etching, a compound film 9 made of a compound of aluminum and an oxide is formed on an inner wall of the through hole 21, as shown in FIG. 8. The compound film 9 fills up a clearance under an inner edge 5a of an antireflection film 5.

Thereafter sputter-etching is performed perpendicularly to the surface of the wafer under a low pressure of 0.1 to 5 mTorr as shown in FIGS. 8 and 4, thereby removing parts of the compound film 9 present on a bottom portion of the through hole 21 and an interlayer isolation film 3.

Referring to FIG. 5, a barrier metal layer 7 is formed and an aluminum wire 8 is embedded in the through hole 21, thereby completing a semiconductor device.

According to the second embodiment of the present invention, the sputter-etching is performed obliquely to the surface of the wafer as shown in FIG. 7, whereby the compound film 9 is efficiently formed on the inner wall of the through hole 21. Thus, the clearance under the inner edge 5a of the antireflection film 5 is efficiently filled up with the compound film 9.

Third Embodiment

A third embodiment of the present invention relates to a clearance filling member filling up a clearance under an inner edge of an antireflection film.

Figure 9:
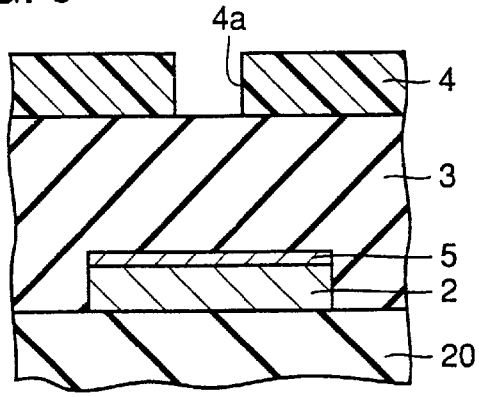
FIGS. 9 to 13 are sectional views successively showing first to fifth steps of a method of fabricating a semiconductor device according to a third embodiment of the present invention.

Referring to FIG. 9, an aluminum wire 2 provided with an antireflection film 5 thereon is formed on an interlayer isolation film 20 formed on a semiconductor substrate (not shown). Another interlayer isolation film 3 is formed on the interlayer isolation film 20, to cover the aluminum wire 2. A resist pattern 4 having an opening 4a in a portion for forming a through hole is formed on the interlayer isolation film 3.

Figure 10:
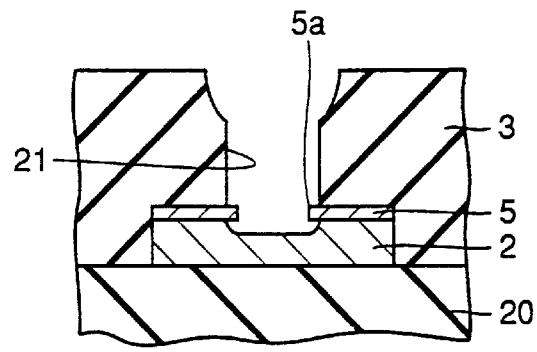

Referring to FIGS. 9 and 10, the interlayer isolation film 3 and the antireflection film 5 are etched through the resist pattern 4 serving as a mask, for forming a through hole 21 exposing a surface of the aluminum wire 2. At this time, an inner edge 5a of the antireflection film 5 remains to horizontally extend in the through hole 21.

Figure 11:
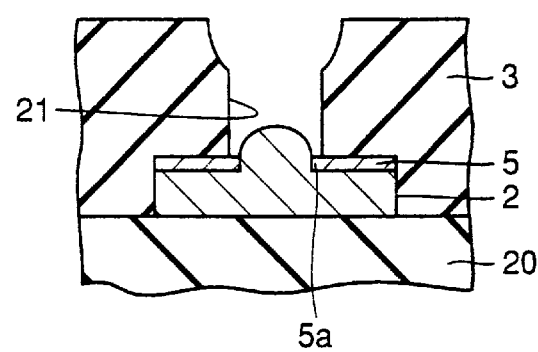

Referring to FIG. 11, a surface of the wafer is etched by sputtering while increasing the temperature of the wafer to 250° C. to 500° C. Thus, the surface of the aluminum wire 2 is bulged on a bottom portion of the through hole 21. The bulged surface of the aluminum wire 2 fills up a clearance under the inner edge 5a of the antireflection film 5.

In general, a metal moves when the recrystallization temperature reaches half the melting point (mp/2). However, a metal film formed by PVD or CVD employed in a semiconductor process contains a number of defects such as holes or dislocations. Therefore, the metal film formed by such a method moves even if the recrystallization temperature is not more than mp/2. Further, the aluminum wire 2 is bulged due to the difference in expansion coefficient between aluminum and the interlayer isolation film 3. As the thickness of the aluminum wire 2 formed under the through hole 21 is increased, therefore, the surface thereof is advantageously readily bulged. The thickness of the aluminum wire 2 is preferably 2000 Å to 2 $\mu$m.

Figure 12:
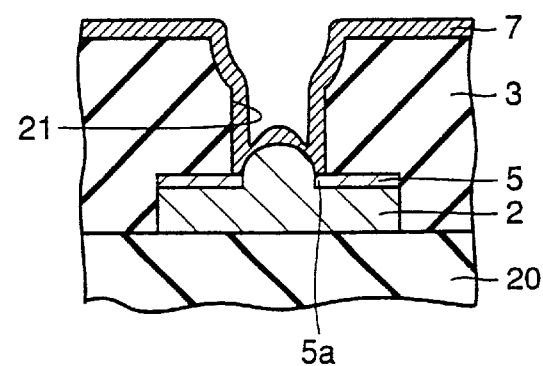

Referring to FIG. 12, a barrier metal layer 7 is formed to cover an inner wall surface and the bottom surface of the through hole 21.

Figure 13:
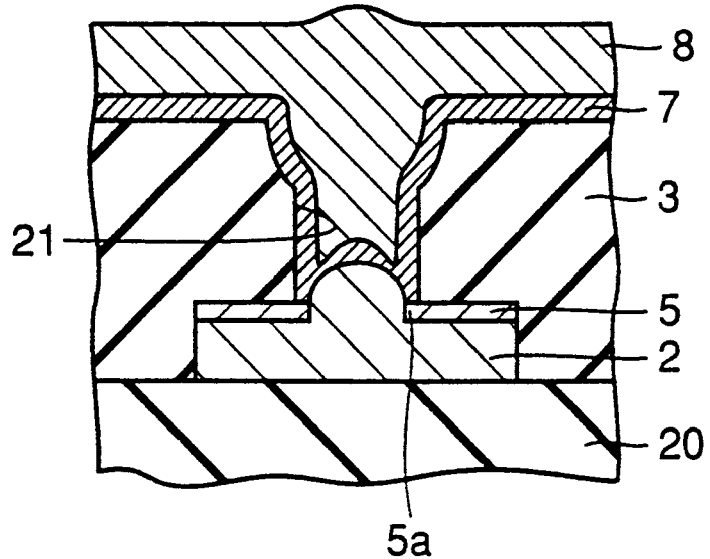
Figure 14:
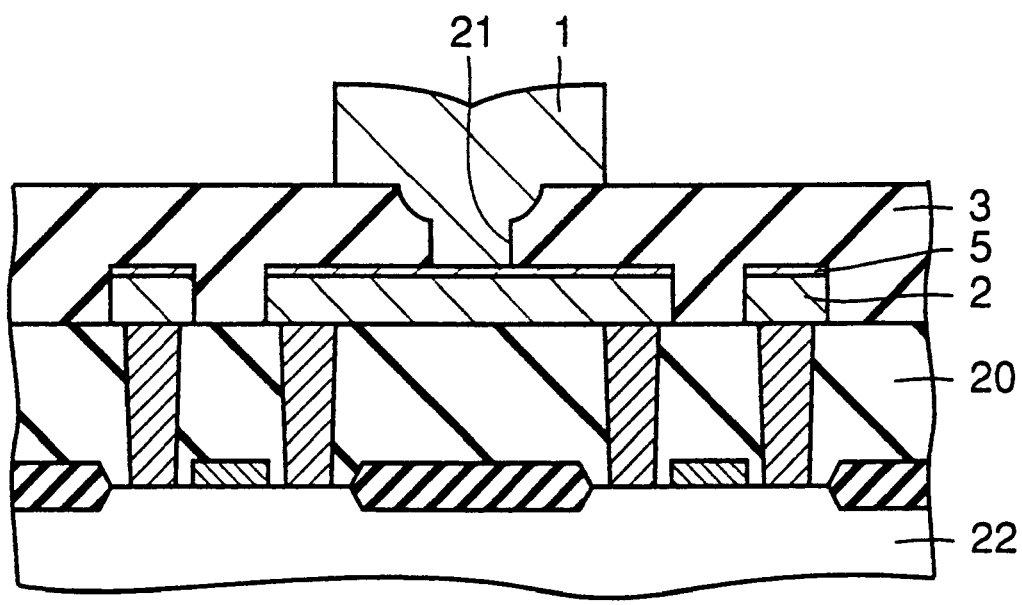
FIG. 14 is a sectional view showing a conventional semiconductor device.
Figure 15:
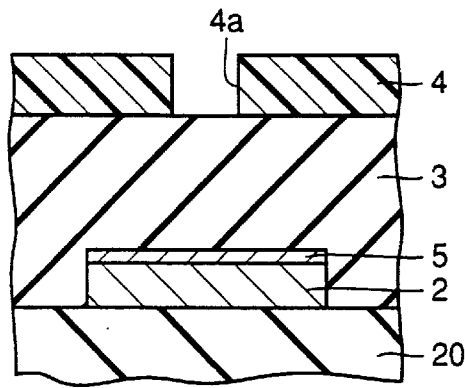
FIGS. 15 to 19 are sectional views successively showing first to fifth steps of a method of fabricating the conventional semiconductor device.
Figure 16:
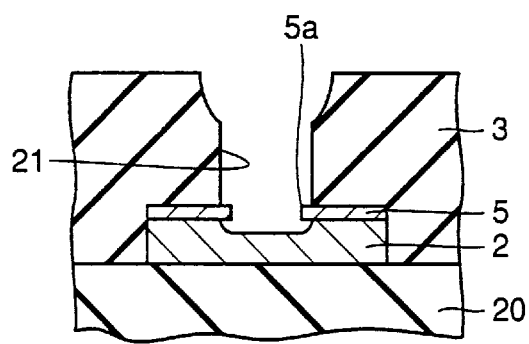
Figure 17:
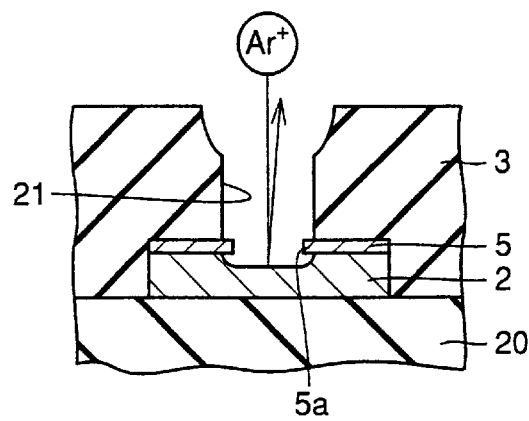
Figure 18:
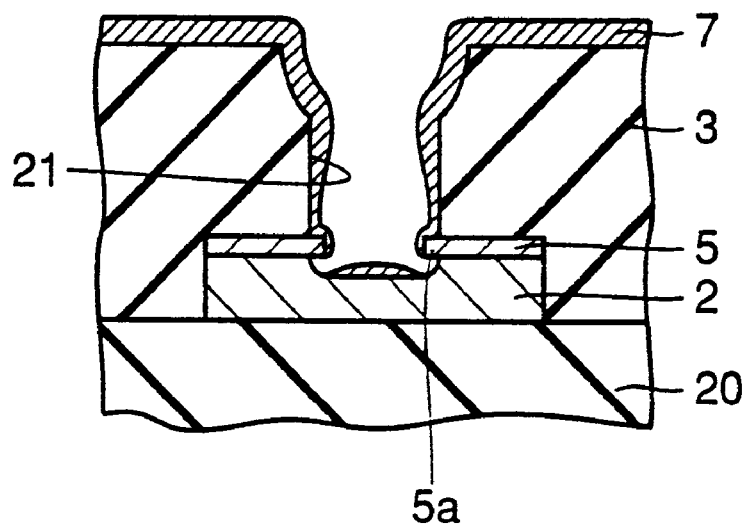
Figure 19:
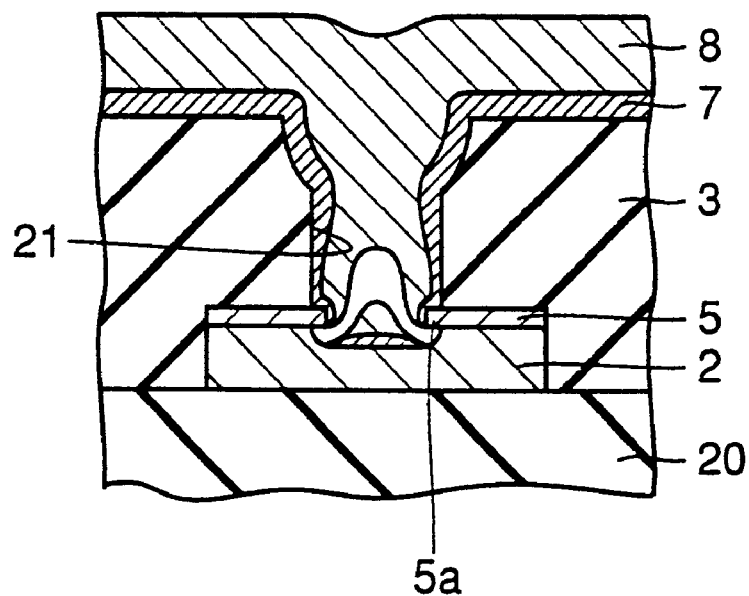

Referring to FIG. 13, an upper aluminum wire 8 is formed to fill up the through hole 21, thereby completing a semiconductor device.

According to this embodiment, the surface of the aluminum wire 2 under the through hole 21 is bulged to fill up a clearance under the inner edge 5a of the antireflection film 5, whereby the upper aluminum wire 8 is not disconnected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate;

a first wiring layer, provided on said semiconductor substrate, having an antireflection film thereon;

an interlayer isolation film provided on said semiconductor substrate to cover said first wiring layer; and a through hole passing through said interlayer isolation film and said antireflection film for partially exposing a surface of said first wiring layer, an inner edge of said antireflection film horizontally extending in said through hole, the semiconductor device further comprising:

a clearance filling member filling up a clearance under said inner edge;

a barrier metal film continuously covering exposed said surface of said first wiring layer, an inner wall surface of said through hole and a surface of said interlayer isolation film; and a second wiring layer passing through said through hole, provided on said interlayer isolation film to be connected with said first wiring layer through said barrier metal film, wherein said clearance filling member fills a second clearance over said inner edge, said second clearance defined by an inner wall of said interlayer isolation film and a top surface of said inner edge.

2. The semiconductor device in accordance with claim 1, wherein said clearance filling member is made of a material obtained by etching a surface of said semiconductor substrate by sputtering.

3. The semiconductor device of claim 1, wherein said through hole extends at least partially through said first wiring layer, thereby forming a groove in said first wiring layer.

4. The semiconductor device of claim 1, wherein said antireflection film is directly connected to said first wiring layer.

5. The semiconductor device of claim 1, wherein said second wiring layer completely fills said through hole.

* * * * *